United States Patent
Minami et al.

(10) Patent No.: US 8,906,165 B2
(45) Date of Patent: Dec. 9, 2014

(54) SUBSTRATE PROCESSING METHOD, STORAGE MEDIUM STORING COMPUTER PROGRAM FOR PERFORMING SUBSTRATE PROCESSING METHOD, AND SUBSTRATE PROCESSING APPARATUS

(75) Inventors: Teruomi Minami, Koshi (JP); Naoyuki Okamura, Koshi (JP); Hirotaka Maruyama, Koshi (JP); Yosuke Kawabuchi, Koshi (JP)

(73) Assignee: Tokyo Electron Limited, Minato-Ku (JP)

( * ) Notice: Subject to any disclaimer, the term of this patent is extended or adjusted under 35 U.S.C. 154(b) by 723 days.

(21) Appl. No.: 13/161,714

(22) Filed: Jun. 16, 2011

(65) Prior Publication Data
US 2011/0308549 A1    Dec. 22, 2011

(30) Foreign Application Priority Data
Jun. 17, 2010    (JP) .................. 2010-138484

(51) Int. Cl.
*B08B 7/04* (2006.01)
*H01L 21/02* (2006.01)
*H01L 21/67* (2006.01)

(52) U.S. Cl.
CPC .... *H01L 21/67028* (2013.01); *H01L 21/02052* (2013.01); *H01L 21/67051* (2013.01)
USPC ............ 134/18; 134/26; 134/32; 134/33; 134/34

(58) Field of Classification Search
None
See application file for complete search history.

(56) References Cited

U.S. PATENT DOCUMENTS

| | | | |
|---|---|---|---|
| 6,261,377 B1 | 7/2001 | Mertens et al. |
| 6,334,902 B1 | 1/2002 | Mertens et al. |
| 7,699,939 B2 | 4/2010 | Nanba |
| 7,806,989 B2 | 10/2010 | Sekiguchi et al. |
| 7,927,429 B2 | 4/2011 | Nanba et al. |
| 2007/0223342 A1 | 9/2007 | Orii et al. |
| 2009/0056764 A1 | 3/2009 | Minami et al. |

FOREIGN PATENT DOCUMENTS

| | | |
|---|---|---|
| JP | 11-233481 A1 | 8/1999 |
| JP | 2003-197590 A1 | 7/2003 |
| JP | 2003-203892 A | 7/2003 |
| JP | 2003-203893 A | 7/2003 |

(Continued)

OTHER PUBLICATIONS

U.S. Appl. No. 13/161,721, filed Jun. 16, 2011, Minami et al.

(Continued)

*Primary Examiner* — Eric Golightly
(74) *Attorney, Agent, or Firm* — Burr & Brown, PLLC

(57) ABSTRACT

In a substrate processing method according to the present invention, a substrate is first processed using a chemical liquid. Next, the substrate is rinsed by supplying a rinsing liquid thereto while the substrate is being rotated. Thereafter, the substrate is dried while the substrate is being rotated. The drying of the substrate includes reducing a rotating speed of the substrate to a first rotating speed lower than that of the substrate during the rinsing of the substrate, while supplying the rinsing liquid to a central portion of the substrate; moving, from the central portion of the substrate toward a peripheral edge portion thereof, a rinsing liquid supply position to which the rinsing liquid is supplied, after the rotating speed of the substrate has been reduced to the first rotating speed; and supplying a drying liquid to the substrate, after the rinsing liquid supply position has been moved.

8 Claims, 6 Drawing Sheets

(56) References Cited

FOREIGN PATENT DOCUMENTS

| | | | |
|---|---|---|---|
| JP | 2005327936 A | * | 11/2005 |
| JP | 2007-173308 A | | 7/2007 |
| JP | 2009-059895 A1 | | 3/2009 |
| JP | 2009-212407 A | | 9/2009 |
| JP | 2009-212408 A | | 9/2009 |
| WO | 2005/050724 A1 | | 6/2005 |

OTHER PUBLICATIONS

Japanese Office Action, Japanese Application No. 2011-133279, dated Aug. 15, 2014 (2 pages).

* cited by examiner

SUBSTRATE PROCESSING METHOD, STORAGE MEDIUM STORING COMPUTER PROGRAM FOR PERFORMING SUBSTRATE PROCESSING METHOD, AND SUBSTRATE PROCESSING APPARATUS

CROSS-REFERENCE TO RELATED APPLICATION

This application is based upon and claims the benefit of priority from the prior Japanese Patent Application No. 2010-138484, filed on Jun. 17, 2010; the entire contents of which are incorporated herein by reference.

FIELD OF THE INVENTION

The present invention relates to a substrate processing method, a storage medium storing a computer program for performing the substrate processing method, and a substrate processing apparatus.

BACKGROUND ART

Semiconductor device fabricating processes, for example, incorporates a substrate processing apparatus that uses a spin chuck to hold a wafer (substrate) and that, while rotating the wafer, cleans the wafer by supplying a chemical liquid thereto (see, for example, JP 2009-59895A).

When the wafer is cleaned with such a substrate processing apparatus, a chemical liquid containing an ammonia component (e.g., an ammonia-hydrogen peroxide mixture (SC1 liquid)) is first delivered to the wafer while the wafer held in the spin chuck is being rotated, to thereby clean the wafer with the SC1 liquid. A dilute hydrofluoric acid (DHF liquid) is next delivered to the wafer to perform cleaning using the DHF liquid before the wafer is rinsed with deionized water (rinsing liquid) delivered thereto. The wafer is thereafter supplied with isopropyl alcohol (IPA) for drying.

SUMMARY OF THE INVENTION

When the cleaning is performed using the SC1 liquid, ammonia is suspended in an ambience in a chamber in which the wafer is accommodated. The ammonia combines with DHF during the cleaning with the DHF liquid to form ammonium fluoride ($NH_4F$). The resulting ammonium fluoride enters a liquid film of the deionized water formed on a surface of the wafer during rinsing. During the drying process that follows thereafter, the deionized water on the surface of the wafer is substituted for an IPA liquid before the wafer is dried. The ammonium fluoride left in the deionized water may, however, be left on the surface of the wafer after the drying. As a result, particles (for example, a line-like water mark produced through precipitation of the chemical liquid or the like) may be formed on the surface of the wafer by the ammonium fluoride.

The present invention is made in view of such circumstances, and on object thereof is to provide a substrate processing method that can inhibit particles from being formed on a surface of a substrate, a storage medium storing a computer program for performing the substrate processing method, and a substrate processing apparatus.

The present invention provides a substrate processing method A substrate processing method comprising: processing the substrate using a chemical liquid; rinsing the substrate by supplying a rinsing liquid thereto while the substrate is being rotated, after the chemical liquid process; and drying the substrate while the substrate is being rotated, after the rinsing of the substrate, wherein: the drying of the substrate including: reducing a rotating speed of the substrate to a first rotating speed lower than that of the substrate in the rinsing of the substrate, while supplying the rinsing liquid to a central portion of the substrate; moving, from the central portion of the substrate toward a peripheral edge portion thereof, a rinsing liquid supply position to which the rinsing liquid is supplied, after the rotating speed of the substrate has been reduced to the first rotating speed; and supplying a drying liquid to the substrate, after the rinsing liquid supply position has been moved.

The present invention provides a storage medium storing a computer program for performing a substrate processing method, the substrate processing method comprising: processing the substrate using a chemical liquid; rinsing the substrate by supplying a rinsing liquid thereto while the substrate is being rotated, after the chemical liquid process; and drying the substrate while the substrate is being rotated, after the rinsing of the substrate, wherein: the drying of the substrate including: reducing a rotating speed of the substrate to a first rotating speed lower than that of the substrate in the rinsing of the substrate, while supplying the rinsing liquid to a central portion of the substrate; moving, from the central portion of the substrate toward a peripheral edge portion thereof, a rinsing liquid supply position to which the rinsing liquid is supplied, after the rotating speed of the substrate has been reduced to the first rotating speed; and supplying a drying liquid to the substrate, after the rinsing liquid supply position has been moved.

The present invention provides a substrate apparatus A substrate processing apparatus comprising: a substrate holding unit capable of rotating, the substrate holding unit being configured to hold a substrate; a rotary driving unit configured to rotatably drive the substrate holding unit; a chemical liquid supply mechanism configured to supply the substrate held in the substrate holding unit with a chemical liquid; a rinsing liquid supply mechanism configured to supply the substrate held in the substrate holding unit with a rinsing liquid via a nozzle; a drying liquid supply mechanism configured to supply the substrate held in the substrate holding unit with a drying liquid; a nozzle driving unit configured to move the nozzle between a position corresponding to a central portion of the substrate and a position corresponding to a peripheral edge portion of the substrate; and a control unit configured to control the rotary driving unit, the chemical liquid supply mechanism, the rinsing liquid supply mechanism, the drying liquid supply mechanism, and the nozzle driving unit, wherein: the control unit controls the rotary driving unit, the rinsing liquid supply mechanism, the drying liquid supply mechanism, and the nozzle driving unit such that, after the rinsing liquid has been supplied to the central portion of the rotating substrate by the rinsing liquid supply mechanism, a rotating speed of the substrate is reduced to a first rotating speed while the rinsing liquid is being supplied to the central portion of the substrate; after the rotating speed of the substrate has been reduced to the first rotating speed, the nozzle is moved from the position corresponding to the central portion of the substrate toward the position corresponding to the peripheral edge portion of the substrate while the rinsing liquid is being supplied to the substrate; and after the nozzle has reached the position corresponding to the peripheral edge portion of the substrate, the drying liquid is supplied to the substrate by the drying liquid supply mechanism.

According to the present invention, particles can be inhibited from being produced on the surface of the substrate.

DETAILED DESCRIPTION OF THE INVENTION

Figure 1:
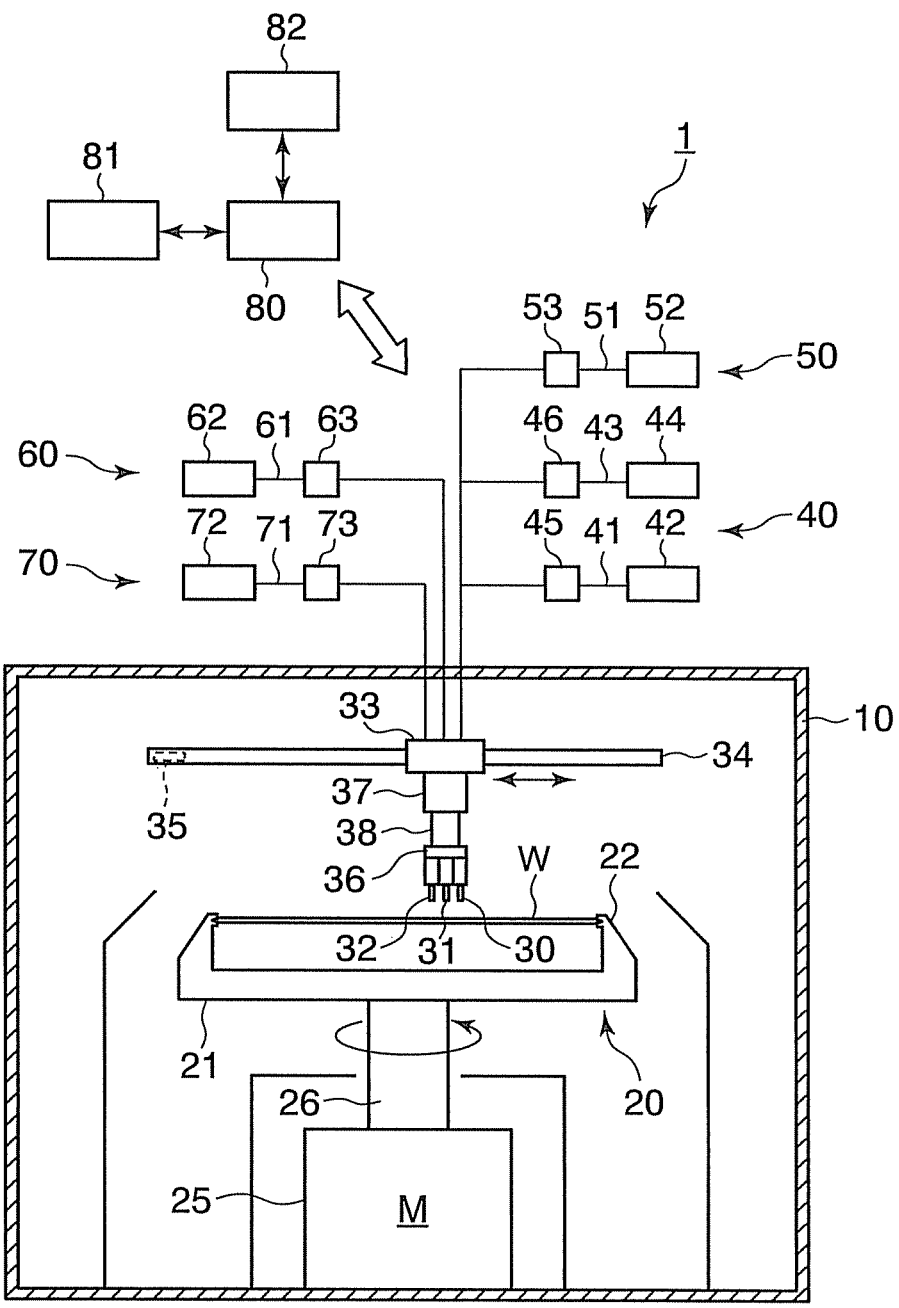
FIG. 1 is a longitudinal cross-sectional view showing a typical cross-sectional arrangement of a substrate processing apparatus according to an embodiment of the present invention.

Embodiment of a substrate processing method, a storage medium storing a computer program for performing the substrate processing method, and a substrate processing apparatus according to the present invention described above will be described below.

In the substrate processing method according to the embodiment of the present invention, it is preferable that in the moving of the rinsing liquid supply position, the rotating speed of the substrate is reduced to a second rotating speed lower than the first rotating speed.

In addition, in the substrate processing method according to the embodiment of the present invention, it is preferable that in the moving of the rinsing liquid supply position, the rotating speed of the substrate is maintained at the second rotating speed after the rotating speed of the substrate has been reduced the second rotating speed.

In addition, in the substrate processing method according to the embodiment of the present invention, it is preferable that in the moving of the rinsing liquid supply position, after the rotating speed of the substrate has been reduced to the second rotating speed, the rinsing liquid supply position reaches the peripheral edge portion of the substrate and the rinsing liquid is stopped from being supplied to the substrate, and thereafter the rotating speed of the substrate is maintained at the second rotating speed for a predetermined period of time.

In addition, in the substrate processing method according to the embodiment of the present invention, it is preferable that in the moving of the rinsing liquid supply position, the rotating speed of the substrate which has been reduced to the first rotating speed is maintained at the first rotating speed.

In addition, in the substrate processing method according to the embodiment of the present invention, it is preferable that in the moving of the rinsing liquid supply position, after the rinsing liquid supply position has reached the peripheral edge portion of the substrate, the rinsing liquid is stopped from being supplied to the substrate, and thereafter the rotating speed of the substrate is maintained at the first rotating speed for a predetermined period of time.

In addition, in the substrate processing method according to the embodiment of the present invention, it is preferable that in the supplying of the drying liquid to the substrate, the rotating speed of the substrate is increased, and thereafter the drying liquid is supplied to the substrate.

In the substrate processing apparatus according to the embodiment of the present invention, it is preferable that the control unit controls the rotary driving unit such that the rotating speed of the substrate is reduced to a second rotating speed lower than the first rotating speed, when the nozzle is moved while the rinsing liquid is being supplied to the substrate.

In addition, in the substrate processing apparatus according to the embodiment of the present invention, it is preferable that the control unit controls the rotary driving unit such that the rotating speed of the substrate is maintained at the second rotating speed after the rotating speed of the substrate has been reduced to the second rotating speed.

In addition, in the substrate processing apparatus according to the embodiment of the present invention, it is preferable that the control unit controls the rotary driving unit, the rinsing liquid supply mechanism, and the nozzle driving unit such that after the rotating speed of the substrate has been reduced to the second rotating speed, the nozzle reaches the position corresponding to the peripheral edge portion of the substrate and the rinsing liquid is stopped from being supplied to the substrate, and thereafter the rotating speed of the substrate is maintained at the second rotating speed for a predetermined period of time.

In addition, in the substrate processing apparatus according to the embodiment of the present invention, it is preferable that the control unit controls the rotary driving unit such that the rotating speed of the substrate which has been reduced to the first rotating speed is maintained at the first rotating speed when the nozzle is moved while the rinsing liquid is being supplied to the substrate.

In addition, in the substrate processing apparatus according to the embodiment of the present invention, it is preferable that the control unit controls the rotary driving unit and the rinsing liquid supply mechanism such that after the nozzle has reached the position corresponding to the peripheral edge portion of the substrate, the rinsing liquid is stopped from being supplied to the substrate, and thereafter the rotating speed of the substrate is maintained at the first rotating speed for a predetermined period of time.

In addition, in the substrate processing apparatus according to the embodiment of the present invention, it is preferable that the control unit controls the rotary driving unit and the drying liquid supply mechanism such that after the nozzle has reached the position corresponding to the peripheral edge portion of the substrate, the rotating speed of the substrate is increased, and thereafter the drying liquid is supplied to the substrate.

A substrate processing method, a storage medium storing a computer program for performing the substrate processing method, and a substrate processing apparatus according to an embodiment of the present invention will be described by referring to FIGS. 1 to 6 in detail.

A general arrangement of a substrate processing apparatus 1 will be described with reference to FIGS. 1 and 2.

Referring to FIG. 1, the substrate processing apparatus 1 generally includes a processing vessel 10, a spin chuck (substrate holding unit) 20 disposed in the processing vessel 10, the spin chuck 20 being capable of rotating, and a rotary driving unit (motor) 25. Specifically, the spin chuck 20 holds a substrate (e.g. a semiconductor wafer; hereinafter referred to simply as a wafer W) to be subjected to cleaning. The rotary driving unit 25 rotatably drives the spin chuck 20.

Figure 2:
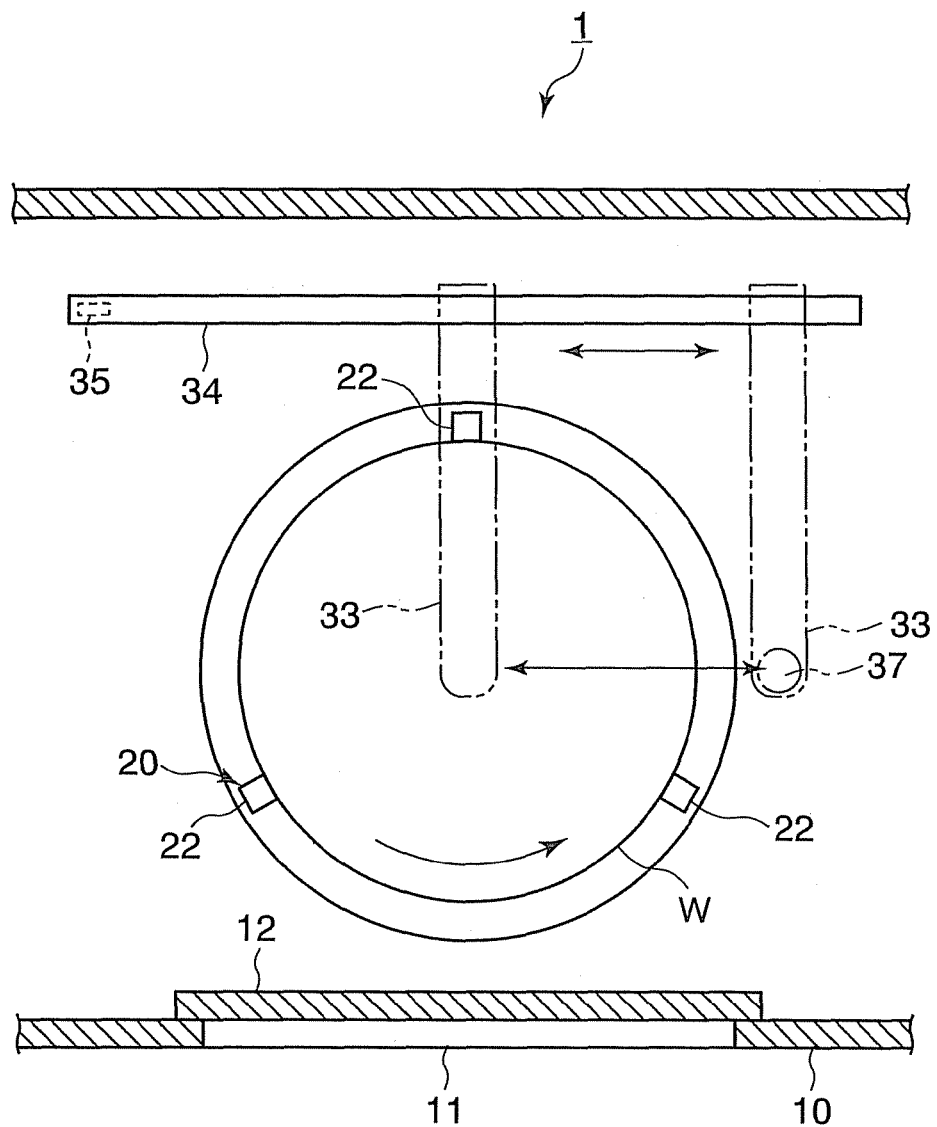
FIG. 2 is a planar cross-sectional view showing a typical cross-sectional arrangement of the substrate processing apparatus according to the embodiment of the present invention.

Referring to FIG. 2, the processing vessel 10 is provided with a loading-unloading port 11 for the wafer W. The loading-unloading port 11 is provided with an openable shutter 12 that opens during loading or unloading of the wafer W. The shutter 12 is disposed inside the processing vessel 10, thus preventing ambience in the processing vessel 10 from leaking outwardly even when pressure in the processing vessel 10 builds up. In addition, the shutter 12 is connected to a control unit 80 to be described later and adapted to be opened or closed based on a control signal from the control unit 80.

Referring to FIG. 1, the spin chuck 20 includes a rotary plate 21 and holding members 22 disposed on a peripheral edge portion of the rotary plate 21. The holding members 22 hold the wafer W in place. The holding members 22 are substantially equally spaced apart from each other on the peripheral edge portion of the rotary plate 21, being adapted to hold the wafer W in a substantially horizontal position.

The rotary driving unit 25 is connected to the rotary plate 21 of the spin chuck 20 via a rotary driving shaft 26. The rotary driving unit 25 is connected to the control unit 80. The rotary driving unit 25 is driven based on a control signal from the control unit 80 to thereby rotate the rotary plate 21, so that the wafer W held in place by the holding members 22 can rotate within a substantially horizontal plane about a center of the rotary plate 21.

Disposed upwardly of the wafer W held by the spin chuck 20 are a cleaning liquid nozzle 30, a drying liquid nozzle 31, and a gas nozzle 32. Specifically, the cleaning liquid nozzle 30 supplies the wafer W with a chemical liquid or deionized water. The drying liquid nozzle 31 supplies the wafer W with a drying liquid. The gas nozzle 32 supplies the wafer W with an inert gas. The cleaning liquid nozzle 30, the drying liquid nozzle 31, and the gas nozzle 32 are connected to a nozzle driving unit 35 via a nozzle arm 33 and a guide rail 34. The guide rail 34 is disposed substantially horizontally in the processing vessel 10. The nozzle arm 33 has a proximal end portion mounted on the guide rail 34 so as to be movable substantially horizontally along the guide rail 34. In this way, the nozzle driving unit 35 is activated, and thereby the cleaning liquid nozzle 30, the drying liquid nozzle 31, and the gas nozzle 32 are integrally moved substantially horizontally between a position corresponding to a central portion of the wafer W (a position upward of the central portion of the wafer W) and a position corresponding to a peripheral edge portion of the wafer W (a position upward of the peripheral edge portion of the wafer W) above the wafer W. Further, the cleaning liquid nozzle 30, the drying liquid nozzle 31, and the gas nozzle 32 are integrally moved also between the position corresponding to the peripheral edge portion of the wafer W and a position upward of a peripheral outward position of the wafer W (a retracted position). Additionally, the control unit 80 is connected to the nozzle driving unit 35, so that the nozzle driving unit 35 is driven based on a control signal from the control unit 80.

The cleaning liquid nozzle 30, the drying liquid nozzle 31, and the gas nozzle 32 are mounted on a connecting member 36 closely to, and in alignment with, each other. A up-down movement driving unit 37 is interposed between the connecting member 36 and a leading end portion of the nozzle arm 33. The up-down movement driving unit 37 integrally raises and lowers the cleaning liquid nozzle 30, the drying liquid nozzle 31, and the gas nozzle 32. In addition, a lift shaft 38 is connected between the connecting member 36 and the up-down movement driving unit 37. Additionally, the control unit 80 is connected to the up-down movement driving unit 37, so that the up-down movement driving unit 37 is driven based on a control signal from the control unit 80 to thereby raise or lower the cleaning liquid nozzle 30, the drying liquid nozzle 31, and the gas nozzle 32. The cleaning liquid nozzle 30, the drying liquid nozzle 31, and the gas nozzle 32 are, in this manner, adjusted for height relative to the wafer W.

The cleaning liquid nozzle 30, the drying liquid nozzle 31, and the gas nozzle 32 are disposed linearly in a radial direction of the wafer W held in the spin chuck 20 and mounted integrally on the nozzle arm 33 such that each of the nozzles 30, 31, and 32 is movable upwardly of the central portion of the wafer W.

A chemical liquid supply mechanism 40 is connected to the cleaning liquid nozzle 30, so that a chemical liquid is delivered (supplied) via the cleaning liquid nozzle 30 to the wafer W held in the spin chuck 20. The chemical liquid supply mechanism 40 according to the embodiment of the present invention includes an SC1 supply source 42 and a DHF supply source 44. The SC1 supply source 42 is connected to the cleaning liquid nozzle 30 via an SC1 supply line 41 to thereby supply the wafer W with the ammonia-hydrogen peroxide mixture (SC1 liquid). The DHF supply source 44 is connected to the cleaning liquid nozzle 30 via a DHF supply line 43 to thereby supply the wafer W with the diluted hydrofluoric acid (DHF liquid). The SC1 supply line 41 is provided with an SC1 open-close valve 45 and the DHF supply line 43 is provided with a DHF open-close valve 46. Additionally, the control unit 80 is connected to the SC1 open-close valve 45 and the DHF open-close valve 46 and each of the SC1 open-close valve 45 and the DHF open-close valve 46 is opened or closed based on a control signal from the control unit 80.

A rinsing liquid supply mechanism 50 is connected to the cleaning liquid nozzle 30, so that deionized water (rinsing liquid) is delivered (supplied) via the cleaning liquid nozzle 30 to the wafer W held in the spin chuck 20. The rinsing liquid supply mechanism 50 includes a rinsing liquid supply source 52 and a rinsing liquid open-close valve 53. The rinsing liquid supply source 52 is connected to the cleaning liquid nozzle 30 via a rinsing liquid supply line 51 to thereby supply the wafer W with the deionized water. The rinsing liquid open-close valve 53 is disposed on the rinsing liquid supply line 51. The control unit 80 is connected to the rinsing liquid open-close valve 53, so that the rinsing liquid open-close valve 53 is opened or closed based on a control signal from the control unit 80.

The SC1 supply line 41, the DHF supply line 43, and the rinsing liquid supply line 51 merge together midway position between the SC1 open-close valve 45, the DHF open-close valve 46, and the rinsing liquid open-close valve 53, respectively, and the cleaning liquid nozzle 30.

A drying liquid supply mechanism 60 is connected to the drying liquid nozzle 31, so that a drying liquid is delivered (supplied) via the drying liquid nozzle 31 to the wafer W held in the spin chuck 20. The drying liquid supply mechanism 60 includes a drying liquid supply source 62 and a drying liquid open-close valve 63. The drying liquid supply source 62 is connected to the drying liquid nozzle 31 via a drying liquid supply line 61 to thereby supply the wafer W with the drying liquid made of isopropyl alcohol (IPA) having a higher volatility than the deionized water. The drying liquid open-close valve 63 is disposed on the drying liquid supply line 61. The control unit 80 is connected to the drying liquid open-close valve 63, so that the drying liquid open-close valve 63 is opened or closed based on a control signal from the control unit 80.

An inert gas supply mechanism 70 is connected to the gas nozzle 32, so that an inert gas is delivered (supplied) via the gas nozzle 32 to the wafer W held in the spin chuck 20. The inert gas supply mechanism 70 includes a gas supply source 72 and a gas open-close valve 73. The gas supply source 72 is connected to the gas nozzle 32 via a gas supply line 71 to thereby supply the wafer W with a nitrogen gas ($N_2$ gas) as the inert gas. The gas open-close valve 73 is disposed on the gas supply line 71. The control unit 80 is connected to the gas open-close valve 73, so that the gas open-close valve 73 is opened or closed based on a control signal from the control unit 80.

As described above, the rotary driving unit 25, the nozzle driving unit 35, the SC1 open-close valve 45 and the DHF open-close valve 46 of the chemical liquid supply mechanism 40, the rising liquid open-close valve 53 of the rinsing liquid supply mechanism 50, the drying liquid open-close valve 63 of the drying liquid supply mechanism 60, and the gas open-close valve 73 of the inert gas supply mechanism 70 are connected with the control unit 80 for controlling the foregoing elements.

The control unit 80 configured as described above controls the rotary driving unit 25, the rinsing liquid open-close valve 53 of the rinsing liquid supply mechanism 50, the drying liquid open-close valve 63 of the drying liquid supply mechanism 60, and the nozzle driving unit 35 such that, during a drying process to be described later, the deionized water is supplied to the wafer W by the rinsing liquid supply mechanism 50 before the IPA liquid is supplied to the wafer W by the drying liquid supply mechanism 60; when the deionized water is supplied, a rotating speed of the wafer W is reduced down to a first rotating speed, and thereafter the cleaning liquid nozzle 30 is being moved from the position corresponding to the central portion of the wafer W toward the position corresponding to the peripheral edge portion of the wafer W, while the deionized water is supplied to the wafer W.

In addition, the control unit 80 controls the rotary driving unit 25, the rinsing liquid open-close valve 53 of the rinsing liquid supply mechanism 50, and the nozzle driving unit 35 such that, when the cleaning liquid nozzle 30 is moved, the rotating speed of the wafer W is reduced further down to a second rotating speed that is lower than the first rotating speed and maintained at the second rotating speed, the cleaning liquid nozzle 30 is moved to, and stopped at, the position corresponding to the peripheral edge portion of the wafer W, the supply of the deionized water to the wafer W is stopped, and then the rotating speed of the wafer W is maintained at the second rotating speed for a predetermined period of time.

Further, the control unit 80 controls the rotary driving unit 25 and the drying liquid open-close valve 63 of the drying liquid supply mechanism 60 such that the rotating speed of the wafer W is increased before the drying liquid supply mechanism 60 supplies the wafer W with the IPA liquid.

Referring to FIG. 1, the control unit 80 is connected to an input-output device 81 that may include a keyboard for performing, for example, command input operations, and a display for displaying, for example, visual operating statuses of the substrate processing apparatus 1 in order for a process manager or the like to manage the substrate processing apparatus 1. In addition, the control unit 80 is capable of accessing a storage medium 82 on which, for example, a program for realizing processes performed by the substrate processing apparatus 1 is stored. The storage medium 82 may be composed of a well-known storage medium, such as ROM, RAM, or other form of memory, hard disks, CD-ROM, DVD-ROM, and flexible disks or other disk-like storage medium. Thus, the control unit 80 performs the program previously stored in the storage medium 82, which results in the substrate processing apparatus 1 processing the wafer W.

Next, the operation of the embodiment of the present invention as described above, specifically, a substrate processing method according to the embodiment of the present invention will be described below. Operation of each component for performing the substrate processing method to be described hereunder is controlled by a control signal from the control unit 80 based on a program previously stored in the storage medium 82.

Figure 3:
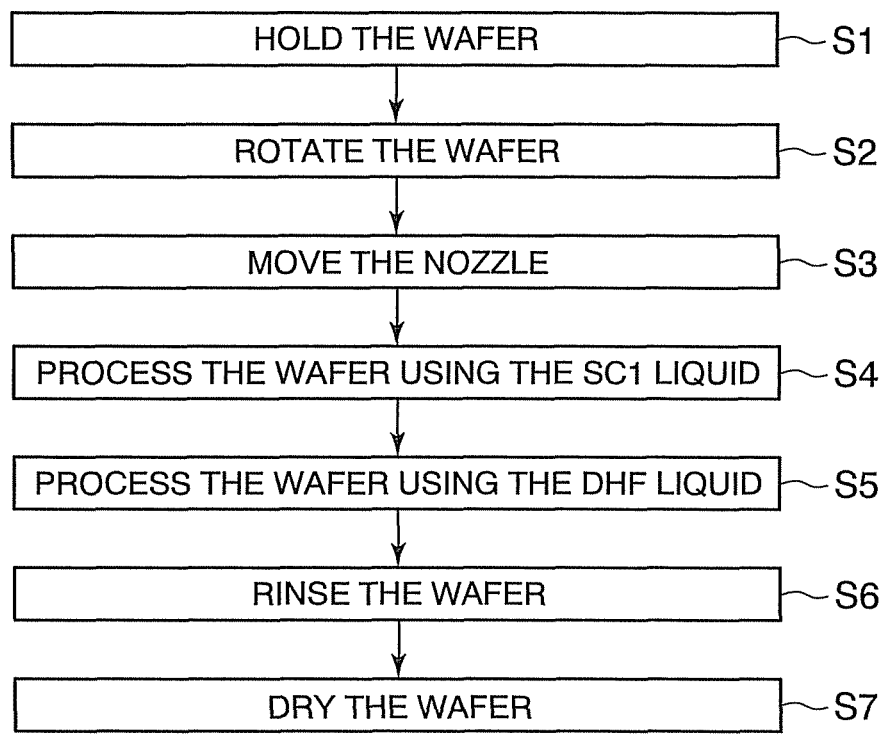
FIG. 3 is a flow chart showing a substrate processing method according to the embodiment of the present invention.

First of all, referring to FIG. 3, the wafer W is held in the spin chuck 20 (step S1). In this case, the shutter 12 is first opened and the wafer W held in place by a transfer arm not shown is loaded into the processing vessel 10 through the loading-unloading port 11. Next, the transfer arm unloads the wafer W, so that the holding members 22 of the spin chuck 20 can hold the wafer W.

The rotary driving unit 25 then rotatably drives the spin chuck 20 that holds the wafer W (step S2).

The nozzle driving unit 35 is thereafter activated, so that the cleaning liquid nozzle 30 located at the retracted position moves to the position corresponding to the central portion of the wafer W held in the spin chuck 20 (step S3).

The wafer W is next subjected to processing using a chemical liquid while being rotated.

In this case, an SC1 liquid is first supplied to a surface of the wafer W to thereby process and clean the surface of the wafer W with the SC1 liquid (step S4). Specifically, the SC1 open-close valve 45 opens to allow the SC1 liquid to be delivered from the SC1 supply source 42 onto the central portion of the surface of the wafer W via the SC1 supply line 41 and the cleaning liquid nozzle 30. This results in the delivered SC1 liquid spreading over an entire surface of the wafer W because of a centrifugal force involved, so that a liquid film of the SC1 liquid is formed on the surface of the wafer W. Preferably, the rotating speed of the wafer W is set at this time to, for example, about 10 to 500 rpm. After the liquid film of the SC1 liquid is formed, the SC1 open-close valve 45 is closed to stop the supply of the SC1 liquid and the wafer W is allowed to stand for a predetermined period of time. This allows the SC1 liquid to be displaced outwardly of the wafer W by the centrifugal force.

Following the cleaning using the SC1 liquid, a DHF liquid is supplied to the surface of the wafer W, so that the surface of the wafer W can be processed and cleaned with the DHF liquid (step S5). Specifically, the DHF open-close valve 46 opens to allow the DHF liquid to be delivered from the DHF supply source 44 onto the central portion of the surface of the wafer W via the DHF supply line 43 and the cleaning liquid nozzle 30. This results in the delivered DHF liquid spreading over the entire surface of the wafer W because of the centrifugal force involved, so that a liquid film of the DHF liquid is formed on the surface of the wafer W. Preferably, the rotating speed of the wafer W is set at this time to, for example, about 10 to 500 rpm. After the liquid film of the DHF liquid is formed, the DHF open-close valve 46 is closed to stop the supply of the DHF liquid and the wafer W is allowed to stand for a predetermined period of time. This allows the DHF liquid to be displaced outwardly of the wafer W by the centrifugal force.

After the processing using the chemical liquids, the wafer W is subjected to rinsing while being rotated (rinsing, process, step S6). Specifically, the rinsing liquid open-close valve 53 opens to allow the deionized water to be delivered from the rinsing liquid supply source 52 onto the central portion of the surface of the wafer W via the rinsing liquid supply line 51 and the cleaning liquid nozzle 30. This results in the delivered deionized water spreading over the entire surface of the wafer W because of the centrifugal force involved to thereby wash away the chemical liquid left on the surface of the wafer W, so that a liquid film of the deionized water is formed on the surface of the wafer W. Preferably, the rotating speed of the wafer W is set at this time to, for example, about 500 to 1500 rpm. This allows the chemical liquid to be quickly washed away from the surface of the wafer W to thereby form the liquid film of the deionized water. At the end of the rinsing process, a thick liquid film of the deionized water with a residual chemical liquid is formed on the surface of the wafer W. The term "thick liquid film" as used herein means that the liquid film is thicker than that at the end of a slow dry step (step S7-1) to be described later.

Figure 4:
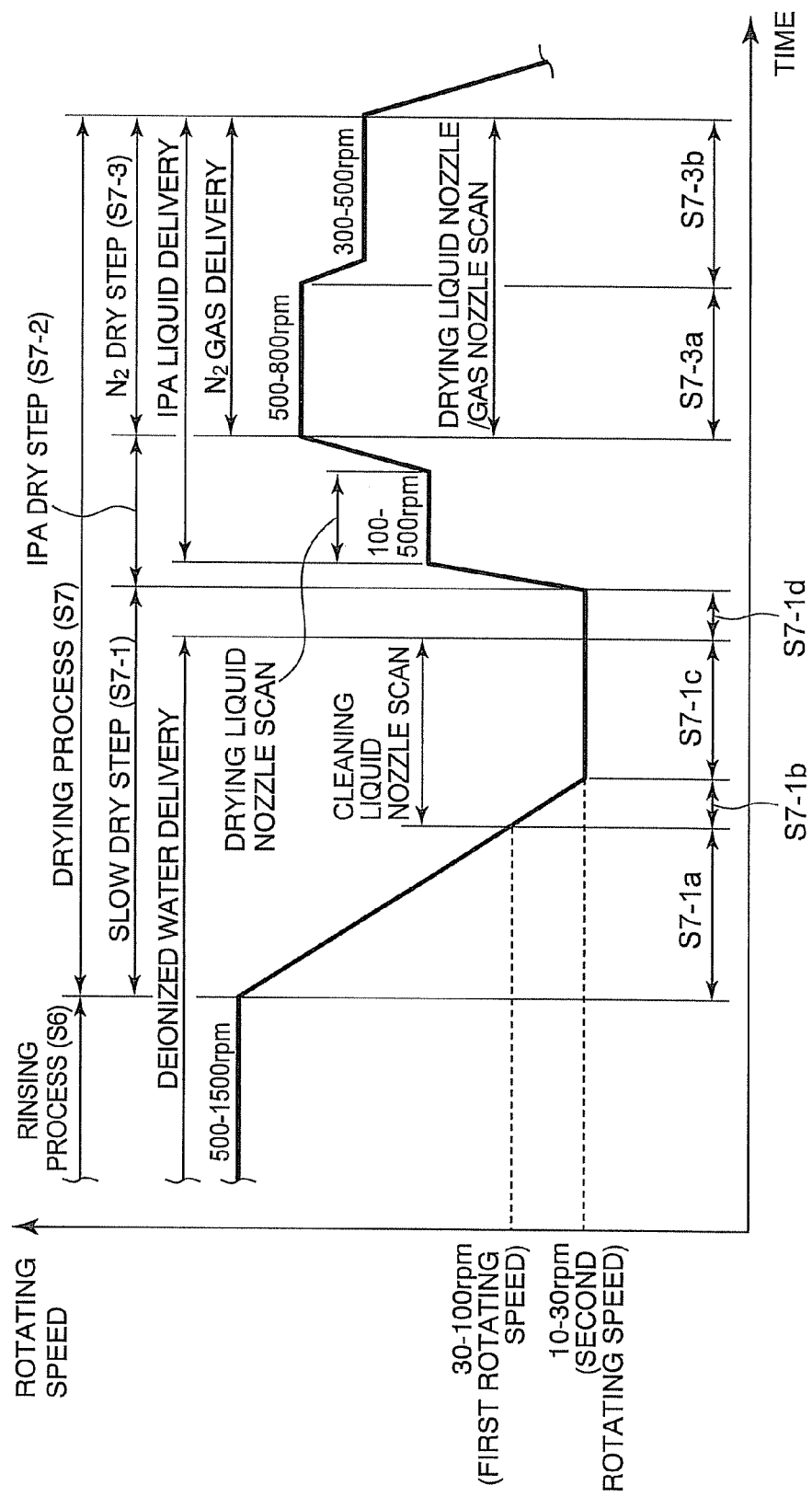
FIG. 4 is a diagram showing changes in a rotating speed of a substrate in the substrate processing method according to the embodiment of the present invention.

After the rinsing process, the wafer W is subjected to drying (drying process, step S7). Referring to FIG. 4, the drying process generally includes a slow dry step (step S7-1), an IPA dry step (step S7-2), and an $N_2$ dry step (step S7-3). Specifically, in the slow dry step, while the deionized water is delivered onto the wafer W, the rotating speed of the wafer W is reduced to a level lower than that in the rinsing process. In the IPA dry step, the IPA liquid is delivered onto the wafer W. In the $N_2$ dry step, the IPA liquid and the nitrogen gas are delivered onto the wafer W.

First, the rotating speed of the wafer W is reduced, while the deionized water is being delivered onto the central portion of the wafer W which has undergone the rinsing process (step S7-1a).

Figure 5:
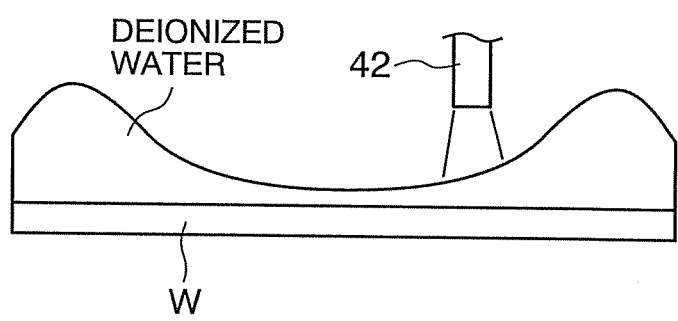
FIG. 5 is an illustration showing a condition of a rinsing liquid during rinsing process in the substrate processing method according to the embodiment of the present invention.

After the rotating speed of the wafer W is reduced to the first rotating speed (30 to 100 rpm), the cleaning liquid nozzle 30 is moved (made to scan) by the nozzle driving unit 35 from the position corresponding to the central portion of the wafer W toward the position corresponding to the peripheral edge portion thereof, while the deionized water is being delivered. This allows a good part of the deionized water to be moved from the central portion of the wafer W toward the peripheral edge portion thereof as the cleaning liquid nozzle 30 moves, as shown in FIG. 5. Following the start of the scan motion of the cleaning liquid nozzle 30, the rotating speed of the wafer W is further reduced for a period of time until the cleaning liquid nozzle 30 reaches a predetermined midway position between the central portion and the peripheral edge portion of the wafer W (step S7-1b). This prevents the deionized water delivered onto the wafer W from splashing against, for example, the holding members 22 of the spin chuck 20 since the rotating speed of the wafer W is reduced as the cleaning liquid nozzle 30 reaches the position corresponding to the peripheral edge portion of the wafer W.

Referring to FIG. 4, the rotating speed of the wafer W is reduced to the second rotating speed (10 to 30 rpm) that is lower than the first rotating speed and is then maintained at the second rotating speed (step S7-1c). During this time, the cleaning liquid nozzle 30 keeps moving to the position corresponding to the peripheral edge portion of the wafer W, while the deionized water is being delivered.

Thereafter, the cleaning liquid nozzle 30 reaches and stops at the position corresponding to the peripheral edge portion of the wafer W and the rinsing liquid open-close valve 53 is closed to thereby stop the supply of the deionized water or the wafer W. The rotating speed of the wafer W is maintained at the second rotating speed for a predetermined period of time (step S7-1d). This allows a good part of the deionized water collected at the peripheral edge portion of the wafer W to be displaced outwardly of the peripheral edge of the wafer W. Even in this case, a thin liquid film of the deionized water is still left on the entire surface of the wafer W by surface tension. Specifically, most of the deionized water containing the ammonium fluoride can be effectively displaced outwardly of the peripheral edge of the wafer W from the surface of the wafer W, while the thin liquid film is left behind. Consequently, even when after this the wafer W is supplied with the IPA liquid to be thereby subjected to the drying process, particles can be inhibited from being produced from the ammonium fluoride or the like. As a result, particles can be inhibited from being produced on the surface of the wafer W. The term "thin liquid film" as used herein means that the liquid film is thinner than that at the end of the rising process (step S6) described earlier.

An IPA dry step (S7-2) is performed after a lapse of a predetermined period of time. In this case, the rotating speed of the wafer W is increased and the drying liquid nozzle 31 is moved to the position corresponding to the central portion of the wafer W. After the rotating speed of the wafer W reaches a third rotating speed (100 to 500 rpm) that is higher than the second rotating speed, the drying liquid open-close valve 63 opens with the drying liquid nozzle 31 located at the position corresponding to the central portion of the wafer W, so that the IPA liquid is delivered from the drying liquid supply source 62 onto the surface of the wafer W via the drying liquid supply line 61 and the drying liquid nozzle 31. Additionally, the drying liquid nozzle 31 makes a round-trip (scans) between the position corresponding to the central portion of the wafer W and the position corresponding to the peripheral edge portion of the wafer W and then returns to the position corresponding to the central portion of the wafer W. While the drying liquid nozzle 31 is making the scan motion, the rotating speed of the wafer W is maintained at the constant third rotating speed. Thereafter, the rotating speed of the wafer W is increased with the IPA liquid kept delivered onto the surface of the wafer W.

Delivering the IPA liquid, onto the surface of the wafer W, while making the drying liquid nozzle 31 scan, allows the deionized water left on the surface of the wafer W to be quickly replaced by the IPA liquid.

Next, after the rotating speed of the wafer W reaches a fourth rotating speed (500 to 800 rpm), the $N_2$ dry step (S7-3) is performed. Specifically, the IPA liquid and the nitrogen gas are delivered onto the surface of the wafer W and the drying liquid nozzle 31 and the gas nozzle 32 move (scan) from the position corresponding to the central portion of the wafer W to the position corresponding toward the peripheral edge portion of the wafer W. At this time, the drying liquid nozzle 31 makes the scan motion so as to be located forwardly of the gas nozzle 32 in a scanning direction.

After the drying liquid nozzle 31 and the gas nozzle 32 have started the scan motion and then the gas nozzle 32 has reached the position corresponding to the central portion of the wafer W, the nitrogen gas may be delivered onto the wafer W. Alternatively, the nitrogen gas may be delivered onto the wafer W at the same time that the drying liquid nozzle 31 and the gas nozzle 32 start the scan motion. In addition, the gas open-close valve 73 is opened, and thereby, the nitrogen gas is delivered from the gas supply source 72 onto the surface of the wafer W via the gas supply line 71 and the gas nozzle 32.

In this $N_2$ dry step (S7-3), the rotating speed of the wafer W is maintained at the constant fourth rotating speed for a period of time until each of the drying liquid nozzle 31 and the gas nozzle 32 moves from the position corresponding to the central portion of the wafer W to a predetermined midway position between the central, portion and the peripheral edge portion of the wafer W (step S7-3a). During this period, each of the drying liquid nozzle 31 and the gas nozzle 32 moves at a relatively high scanning speed (e.g. 8 mm/sec).

After each of the drying liquid nozzle 31 and the gas nozzle 32 reaches the abovementioned predetermined midway position, the rotating speed of the wafer W is reduced to a fifth rotating speed (300 to 500 rpm) and, until each of the drying liquid nozzle 31 and the gas nozzle 32 reaches the position corresponding to the peripheral edge portion of the wafer W, the rotating speed of the wafer W is maintained at the constant fifth rotating speed (step S7-3b). During this time, each of the drying liquid nozzle 31 and the gas nozzle 32 moves at a relatively low scanning speed (e.g. 3 mm/sec).

In this $N_2$ dry step (S7-3), the nitrogen gas is delivered rearwardly, in the moving direction, of a position to which the IPA liquid is delivered. This allows the nitrogen gas to be quickly delivered onto the IPA liquid delivered onto the surface of the wafer W, so that the IPA liquid can be quickly removed from the surface of the wafer W to thereby dry the wafer W.

After each of the drying liquid nozzle 31 and the gas nozzle 32 reaches the position corresponding to the peripheral edge portion of the wafer W, the drying liquid open-close valve 63 and the gas open-close valve 73 are closed to thereby stop the supply of the IPA liquid and the nitrogen gas for the wafer W. The rotating speed of the wafer W is then reduced and the drying process for the wafer W is completed.

The wafer W is thereafter stopped rotating and, by reversing the order of loading of the wafer W, the transfer arm not shown is inserted downwardly of the wafer W, and the wafer W is transferred onto the transfer arm and unloaded.

According to the embodiment of the present invention, after the rinsing process of supplying the center of the wafer W with the deionized water as the rinsing liquid, the rotating speed of the wafer W is reduced; after the rotating speed of the wafer W is reduced to the first rotating speed, the wafer W is supplied with the deionized water, while the rinsing liquid supply position at which the wafer W is supplied with the deionized water is being moved from the central portion of the wafer W toward the peripheral edge portion thereof. This allows a good part of the deionized water on the surface of the wafer W to be displaced outwardly of the peripheral edge of the wafer W. The ammonium fluoride, which is contained in the liquid film of the deionized water formed on the surface of the wafer W particularly when the SC1 liquid and the DHF liquid are used to perform the chemical liquid cleaning, can be effectively displaced outwardly of the peripheral edge of the wafer W from the surface of the wafer W. Specifically, most of the deionized water containing the ammonium fluoride can be effectively displaced outwardly of the peripheral edge of the wafer W from the surface of the wafer W, while the thin liquid film is left behind. Consequently, even when after this the wafer W is supplied with the IPA liquid to be thereby subjected to the drying process, particles can be inhibited from being produced from the ammonium fluoride or the like. As a result, particles can be inhibited from being produced on the surface of the wafer W.

Additionally, according to the embodiment of the present invention, in the above-described slow dry step (S7-1), a good part of the deionized water is displaced outwardly of the peripheral edge of the wafer W from the surface of the wafer W. Even in this case, a thin liquid film of the deionized water can be formed on the surface of the wafer W. Accordingly, particles, such as water mark, can be inhibited from being produced on the surface of the wafer W.

Additionally, according to the embodiment of the present invention, following the slow dry step (S7-1), the IPA liquid is supplied to the wafer W, while the drying liquid nozzle 31 is being made to scan (IPA dry step (S7-2)). This leaves only a small amount of deionized water on the surface of the wafer W, which allows the deionized water left on the surface of the wafer W to be quickly replaced by the IPA liquid. Particles can therefore be inhibited from being produced on the surface of the wafer W. In addition, because the liquid film of the deionized water left on the surface of the wafer W is thin, the amount of IPA liquid required for the replacement of the deionized water can be reduced.

Additionally, according to the embodiment of the present invention, following the IPA dry step (S7-2), the IPA liquid and the nitrogen gas are supplied to the wafer W while the drying liquid nozzle 31 and the gas nozzle 32 are made to scan ($N_2$ dry step (S7-3)). At this time, the gas nozzle 32 is located rearwardly of the drying liquid nozzle 31 relative to the moving direction thereof. This allows the nitrogen gas to be quickly delivered onto the IPA liquid delivered onto the surface of the wafer W, so that the IPA liquid can be quickly removed. Particles can therefore be inhibited from being produced on the surface of the wafer W.

While the embodiments of the present invention have been described and illustrated above, those may be, of course, modified into various forms within the scope of the concept of the present invention. Hereinafter, representative modified examples will be described.

In the embodiment of the present invention, the rinsing liquid supply position is moved from the central portion of the wafer W toward the peripheral edge portion thereof after the rotating speed of the wafer W is reduced to the first rotating speed, and thereafter the rotating speed of the wafer W is further reduced. However, not limited thereto, after the rotating speed of the wafer W is reduced to the first rotating speed (e.g. 30 to 100 rpm), the rotating speed of the wafer W may be maintained at the first rotating speed, while the rinsing liquid supply position is being moved from the central portion of the wafer W toward the peripheral edge portion thereof. Specifically, in step S7-1b in the rinsing process shown in FIG. 4, the cleaning liquid nozzle 30 is stopped at the position corresponding to the central portion of the wafer W and, in step S7-1c, the cleaning liquid nozzle 30 is moved from the position corresponding to the central portion of the wafer W to the position corresponding to the peripheral edge portion of the wafer W. This allows a good part of the deionized water on the surface of the wafer W to be moved from the central portion of the wafer W toward the peripheral edge portion thereof and eventually displaced outwardly of the peripheral edge of the wafer W, as the cleaning liquid nozzle 30 is moved.

In addition, in the embodiment of the present invention described above, the IPA dry step (S7-2) and the $N_2$ dry step (S7-3) may be performed as detailed below.

Figure 6:
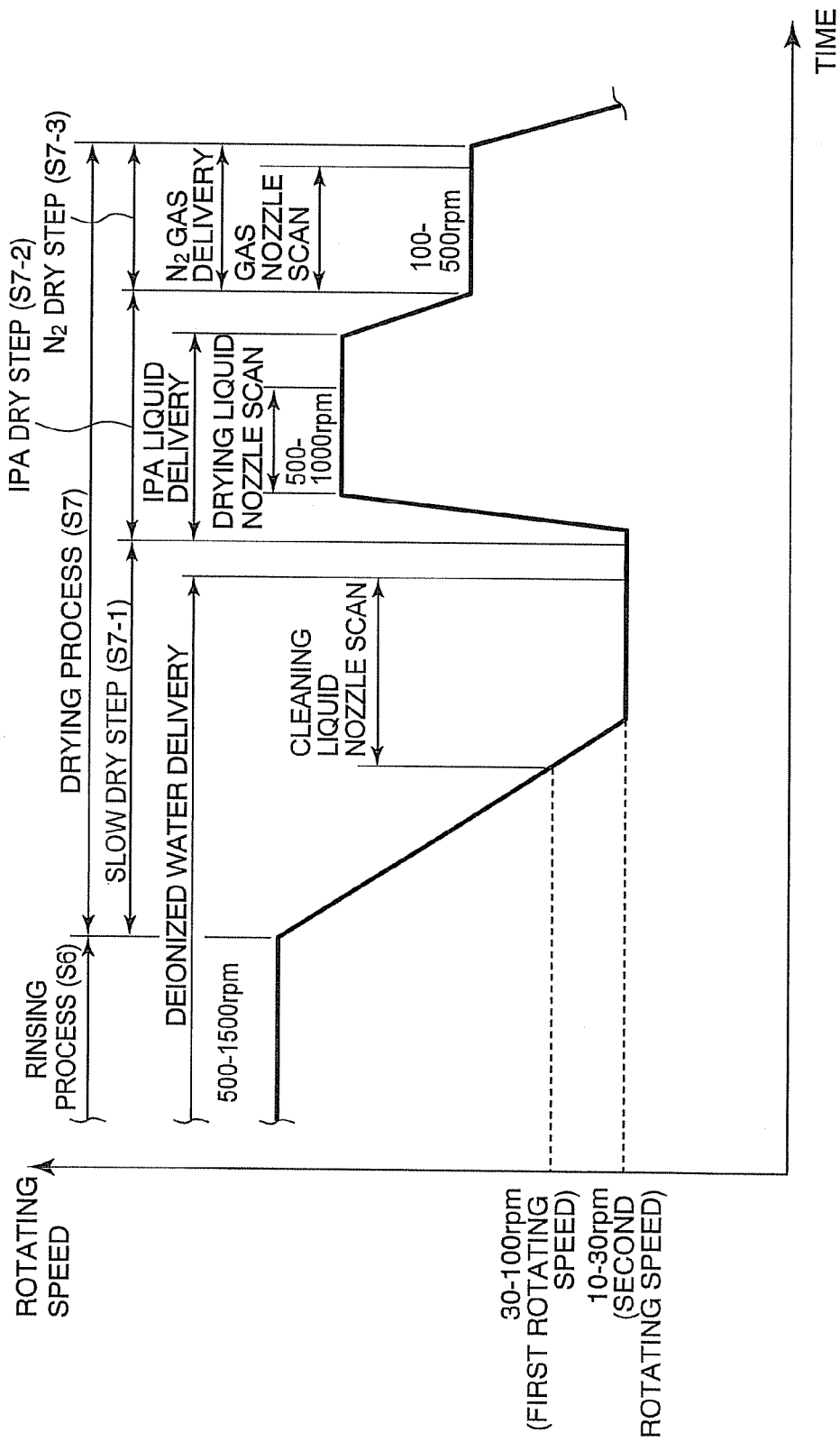
FIG. 6 is a diagram showing a modified example of changes in the rotating speed of the substrate in the substrate processing method according to the embodiment of the present invention.

Specifically, referring to FIG. 6, after the lapse of the predetermined period of time in step S7-1d, the supply of the IPA liquid is started before the rotating speed of the wafer W is increased, next, the rotating speed of the wafer W is increased to 500 to 1000 rpm and the drying liquid nozzle 31 is made to scan from the position corresponding to the peripheral edge portion of the wafer W to the position corresponding to the central portion of the wafer W. Then, while the drying liquid nozzle 31 is kept at the position corresponding to the central portion of the wafer W, the IPA liquid is delivered for a predetermined period of time, and thereafter the supply of the IPA liquid is stopped and the rotating speed of the wafer W is reduced to 100 to 500 rpm (IPA dry step). Following the IPA dry step, the nitrogen gas is delivered onto the wafer W from the gas nozzle 32 ($N_2$ dry step). While the nitrogen gas is being delivered, the gas nozzle 32 is made to scan from the position corresponding to the central portion of the wafer W to the position corresponding to the peripheral edge portion of the wafer W.

In this case, the IPA liquid can be even more quickly supplied to the deionized water left on the surface of the wafer W, so that the deionized water can be quickly replaced by the IPA liquid. This inhibits particles from being produced on the surface of the wafer W. In addition, following the delivery of the IPA liquid, only the nitrogen gas is delivered onto the wafer W, while the gas nozzle 32 is being made to scan. This removes the IPA liquid left on the surface of the wafer W. In this case, the amount of IPA liquid to be used in the drying process can be reduced.

In the embodiment of the present invention, the wafer W is subjected to the chemical liquid cleaning using the SC1 liquid and the DHF liquid. The chemicals used in the cleaning are not limited to the foregoing. Alternatively, any type of chemical liquids may be used. In this case, even if the type of chemical liquid used does not contain an ammonia component, ammonia may naturally exist in the processing vessel 10, so that the ammonium fluoride can be produced during chemical cleaning using the DHF liquid, and then the ammonium fluoride enters the deionized water. Even in this case, particles composed of the ammonium fluoride can be inhibited from being produced on the surface of the wafer W.

In the embodiment of the present invention, following the cleaning using the SC1 liquid, the DHF liquid is delivered onto the wafer W to perform the cleaning using the DHF liquid. However, not limited thereto, following the cleaning using the SC1 liquid, the deionized water may be delivered onto the surface of the wafer W to thereby rinse the surface of the wafer W; thereafter, the cleaning using the DHF liquid may be performed.

In the embodiment of the present invention, the deionized water is used as the rinsing liquid. The deionized water is not, however, the only possible option to be used as the rinsing liquid.

In the embodiment of the present invention, the IPA liquid is used as the drying liquid. The IPA liquid is not, however, the only possible option to be used as the drying liquid. In addition, the IPA liquid to be delivered onto the wafer W is not limited to a liquid form. Alternatively, the IPA liquid may be in a mist form or a jet form. Further, the wafer W may be supplied with a heated IPA liquid. In this case, vaporization of the IPA liquid may be promoted.

The description given heretofore exemplifies the substrate processing method, the storage medium storing a computer program for performing the substrate processing method, and the substrate processing apparatus according to the present invention as applied to cleaning processes of the semiconductor wafer W. However, the present invention may nonetheless be applied to cleaning of various other types of substrates including an LCD substrate and a CD substrate.

The invention claimed is:

1. A substrate processing method comprising:
processing the substrate using a chemical liquid;
rinsing the substrate by supplying a rinsing liquid thereto while the substrate is being rotated, after the chemical liquid process; and
drying the substrate while the substrate is being rotated, after the rinsing of the substrate,
wherein: the drying of the substrate includes:
reducing a rotating speed of the substrate to a first rotating speed lower than that of the substrate in the rinsing of the substrate, while supplying the rinsing liquid to a central portion of the substrate;
moving, from the central portion of the substrate toward a peripheral edge portion thereof, a rinsing liquid supply position to which the rinsing liquid is supplied, after the rotating speed of the substrate has been reduced to the first rotating speed; and
supplying a diving liquid to the substrate, after the rinsing liquid supply position has been moved,
wherein during the moving of the rinsing liquid supply position, a thin liquid film of the rinsing liquid, which is thinner than that in the rinsing of the substrate, is formed on the surface of the substrate, and
wherein during the supplying of the drying liquid to the substrate, the liquid film of the rinsing liquid is replaced by the drying liquid.

2. The substrate processing method according to claim 1, wherein: in the moving of the rinsing liquid supply position, the rotating speed of the substrate is reduced to a second rotating speed lower than the first rotating speed.

3. The substrate processing method according to claim 2, wherein: in the moving of the rinsing liquid supply position, the rotating speed of the substrate is maintained at the second rotating speed after the rotating speed of the substrate has been reduced to the second rotating speed.

4. The substrate processing method according to claim 2, wherein: in the moving of the rinsing liquid supply position, after the rotating speed of the substrate has been reduced to the second rotating speed, the rinsing liquid supply position reaches the peripheral edge portion of the substrate and the rinsing liquid is stopped from being supplied to the substrate, and thereafter the rotating speed of the substrate is maintained at the second rotating speed for a predetermined period of time.

5. The substrate processing method according to claim 1, wherein: in the moving of the rinsing liquid supply position, the rotating speed of the substrate which has been reduced to the first rotating speed is maintained at the first rotating speed.

6. The substrate processing method according to claim 1, wherein: in the moving of the rinsing liquid supply position, after the rinsing liquid supply position has reached the peripheral edge portion of the substrate, the rinsing liquid is stopped from being supplied to the substrate, and thereafter the rotating speed of the substrate is maintained at the first rotating speed for a predetermined period of time.

7. The substrate processing method according to claim 1, wherein: in the supplying of the drying liquid to the substrate, the rotating speed of the substrate is increased, and thereafter the drying liquid is supplied to the substrate.

8. A storage medium storing a computer program for performing a substrate processing method,
the substrate processing method comprising:
processing the substrate using a chemical liquid;
rinsing the substrate by supplying a rinsing liquid thereto while the substrate is being rotated, after the chemical liquid process; and
drying the substrate while the substrate is being rotated, after the rinsing of the substrate,
wherein: the drying of the substrate includes:
reducing a rotating speed of the substrate to a first rotating speed lower than that of the substrate in the rinsing of the substrate, while supplying the rinsing liquid to a central portion of the substrate;
moving, from the central portion of the substrate toward a peripheral edge portion thereof, a rinsing liquid supply position to which the rinsing liquid is supplied, after the rotating speed of the substrate has been reduced to the first rotating speed; and
supplying a drying liquid to the substrate, after the rinsing liquid supply position has been moved,
wherein during the moving of the rinsing liquid supply position, a thin liquid film of the rinsing liquid, which is thinner than that in the rinsing of the substrate, is formed on the surface of the substrate, and wherein during the supplying of the drying liquid to the substrate, the liquid film of the rinsing liquid is replaced by the drying liquid.

* * * * *